United States Patent [19]
Yuasa et al.

[11] Patent Number: 5,585,795
[45] Date of Patent: Dec. 17, 1996

[54] D/A CONVERTER INCLUDING OUTPUT BUFFER HAVING A CONTROLLABLE OFFSET VOLTAGE

[75] Inventors: Tachio Yuasa; Osamu Kobayashi; Kunihiko Gotoh, all of Kawasaki, Japan

[73] Assignee: Fujitsu Limited, Kawasaki, Japan

[21] Appl. No.: 293,279

[22] Filed: Aug. 16, 1994

Related U.S. Application Data

[63] Continuation of Ser. No. 42,675, Apr. 5, 1993, abandoned.

[51] Int. Cl.⁶ .................................................. H03M 1/06
[52] U.S. Cl. ........................................ 341/118; 341/144
[58] Field of Search .................................. 341/118, 119, 341/120, 121, 144, 138; 307/491, 296.1; 330/9, 259

[56] References Cited

U.S. PATENT DOCUMENTS

| | | | |
|---|---|---|---|
| 4,740,776 | 4/1988 | Sloane | 341/118 |
| 5,103,122 | 4/1992 | O'Leary et al. | 307/491 |

FOREIGN PATENT DOCUMENTS

| | | |
|---|---|---|
| 1272354 | 7/1968 | Germany . |
| 2-1046 | 1/1990 | Japan . |
| 2093297 | 8/1982 | United Kingdom . |

OTHER PUBLICATIONS

Utilisation Avec Une, *Toute l'Electronique*, Aug.-Sep. 1985, France, No. 506, pp.94–99.

*Primary Examiner*—Brian K. Young
*Attorney, Agent, or Firm*—Staas & Halsey

[57] ABSTRACT

A D/A converter includes an analog voltage generating circuit for generating an analog voltage, and an offset-controllable amplifier amplifying the analog voltage with a predetermined amplification factor and outputting an analog output signal. An offset voltage generating circuit generates an offset voltage which is varied on the basis of a digital input signal. The offset voltage controls an offset of the offset-controllable amplifier.

19 Claims, 7 Drawing Sheets

D/A CONVERTER INCLUDING OUTPUT BUFFER HAVING A CONTROLLABLE OFFSET VOLTAGE

This application is a continuation of application Ser. No. 08/042,675, filed Apr. 5, 1993, now abandoned.

BACKGROUND OF THE INVENTION

1. Field of the Invention

The present invention generally relates to D/A (Digital-to-Analog) converters, and more particularly to a D/A converter including an offset-controllable amplifier used as an output buffer.

2. Description of the Prior Art

FIG. 1 is a circuit diagram of a conventional D/A converter fabricated with a resistor network. A resistor network is made up of resistors $R_0$–$R_{k-1}$ connected in series. The resistors have the same resistance as each other. A ground potential ($E_0$=0 V) is applied to one end of the resistor network, and a power supply voltage $V_R$ (=$E_k$) is applied to the another end of the resistor network. Analog switches $S_0$–$S_k$ are connected to the resistor network. More particularly, first terminals of the analog switches $S_0$–$S_k$ are connected to respective nodes of the resistor network, and second terminals of the switches are connected to each other and to the non-inverting input terminal of an operational amplifier OP. One of the (k +1) analog switches $S_0$–$S_k$ is selected on the basis of a digital input signal value, and the potential at the corresponding node is applied to the non-inverting input terminal of the operational amplifier OP.

The inverting input terminal of the operational amplifier OP, which functions as a unit-gain amplifier, is connected to the output terminal of the operational amplifier OP. The operational amplifier outputs an analog output voltage $V_{OUT}$ corresponding to the potential of the selected node.

The correspondence between the selecting operation on the analog switches $S_0$–$S_k$ and the analog output signal $V_{OUT}$ can be expressed by the following equation when only one $S_X$ (X is one of 0–k) of the (k +1) switches is ON and the other switches are OFF:

$$V_{OUT}=E_X=(X/k) \cdot V_R.$$

It can be seen from the above equation that (k+1) analog voltages ($E_0$, $E_1$, $E_2$, . . . , $E_{k-2}$, $E_{k-1}$, $E_k$) having a step size equal to $(1/k)V_R$ are obtained by turning ON only one of the (k+1) switches.

The D/A converter shown in FIG. 1 functions as an n-bit D/A converter by controlling the (k+1) analog switches $S_0$–$S_k$ by means of decoded signals of a digital input signal (an n-bit digital input signal is decoded into $2^n$ decoded signals). For example, when all bits of the digital input signal are equal to zero, the decoded signals turn only the switch $S_0$ ON, and the analog output voltage $V_{OUT}$ is equal to 0 V (=$E_0$). When all bits of the digital input signal are equal to one, the decoded signals turn only the switch $S_k$ ON, and the analog output signal $V_{OUT}$ is equal to $V_R$ (=$E_k$). When the bits of the digital input signal have values other than all zeros and all ones, one of the switches $S_1$–$S_{k-1}$ is turned ON in response to the decoded signals, and a corresponding one of the output voltages $E_1$, $E_2$, . . . , $E_{k-1}$ is output as the analog output voltage $V_{OUT}$.

The number of analog switches needed is equal to the number of decoded signals. That is, $2^n$ decoded signals are needed to perform the D/A converting operation on the n-bit digital input signal. Hence, $2^n$ analog switches are needed. Further, a minimum number of resistors needed is equal to $2^n-1$.

However, the above-mentioned conventional D/A converter has a disadvantage in that the number of required parts, such as analog switches and resistors exponentially increases as the number of bits of the digital input signal increases. For example, when the number of bits to be handled is increased from 8 to 10, the number of analog switches must be increased from $2^8$ (=256) to $2^{10}$ (=$2^8 \cdot 2^2$). That is, the number of analog switches necessary to process 10 bits increases by four times the number of analog switches necessary to process 8 bits. Further, in the above case, the number of resistors must be increased from $2^8-1$ (=255) to $2^{10}-1$ (=$2^8 \cdot 2^2-1$=1023). That is, the number of resistors necessary to process 10 bits increases by approximately four times the number of resistors necessary to process 8 bits.

Compared to the 8-bit D/A converter fabricated on an IC chip, a very large area on the chip is needed to form the 10-bit D/A converter. Exactly, the on-chip D/A converter needs a chip area approximately equal to four times the area for $2^8$ switches and a chip area approximately equal to four the area for $2^8-1$ resistors.

SUMMARY OF THE INVENTION

It is a general object of the present invention to provide a D/A converter in which the above disadvantages are eliminated.

A more specific object of the present invention is to provide a D/A converter capable of processing a large number of bits of a digital input signal without a large increase in the number of parts.

The above objects of the present invention are achieved by a D/A converter comprising:

analog voltage generating means for generating an analog voltage;

an offset-controllable amplifier amplifying the analog voltage with a predetermined amplification factor and outputting an analog output signal; and offset voltage generating means, coupled to the offset-controllable amplifier, for generating an offset voltage which is varied on the basis of a digital input signal, the offset voltage controlling an offset of the offset-controllable amplifier.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 2:
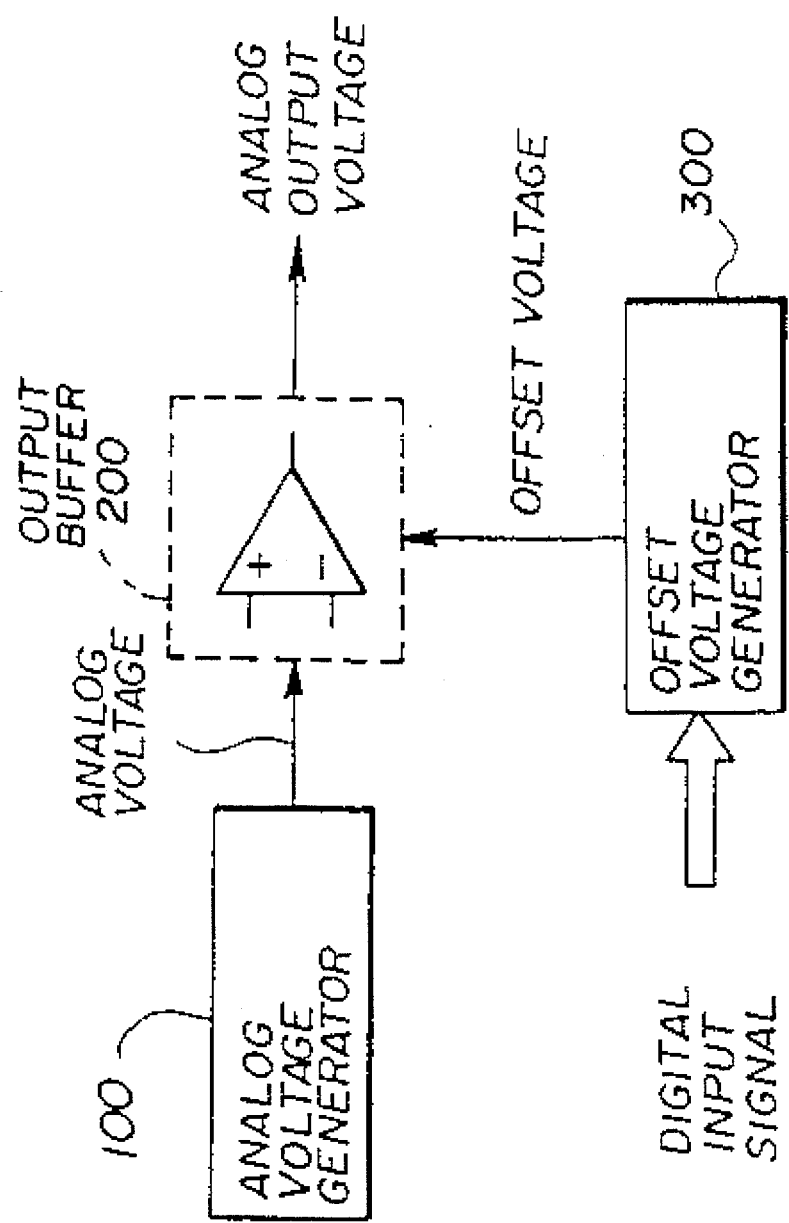
FIG. 2 is a block diagram illustrating an overview of a D/A converter according to a first embodiment of the present invention.

FIG. 2 illustrates an overview of a D/A converter according to the first embodiment of the present invention. The D/A converter shown in FIG. 2 comprises an analog voltage generator 100, an output buffer 200, and an offset voltage generator 300. The analog voltage generator 100 generates an analog voltage, which is applied to the output buffer 200. The offset voltage generator 300 generates an offset voltage, which is varied by a digital input signal. The offset voltage is applied to the output buffer 200. The output buffer 200 has a controllable offset and a predetermined amplification factor.

The output buffer 200 amplifies the sum $(V\alpha+V\beta)$ of the analog voltage $(V\alpha)$ and the offset voltage $(V\beta)$ at the predetermined amplification factor. When the predetermined amplification factor of the output buffer 300 is equal to 1, $V\alpha$ is x[V], and $V\beta$ is one of m stepwise voltages between $y_0$[V] and $y_{m-1}$[V], the analog output voltage is one of stepwise voltages between $(x+y_0)$ and $(x+y_{m-1})$. This means that the number of steps of change in the analog voltage $V\alpha$ is increased by m−1 times the number of the original steps. If the analog voltage $V\alpha$ stepwise changes at $2^n$ steps, the following equation can be obtained:

$$2^n \times m = 2^n \times 2^p = 2^{n+p}.$$

That is, the resolution of the D/A conversion is increased to $2^{n+p}$, and the number of bits of the digital input signal is increased from n bits to (n+p) bits.

The following should be noted. According to the aforementioned prior art, a p-bit increase in the digital input signal needs $2^p$ times the number of parts necessary for the original D/A converter. According to the present invention, a p-bit increase in the digital input signal needs several $2^p$ additionals of the number of parts necessary for the original D/A converter.

Figure 3:
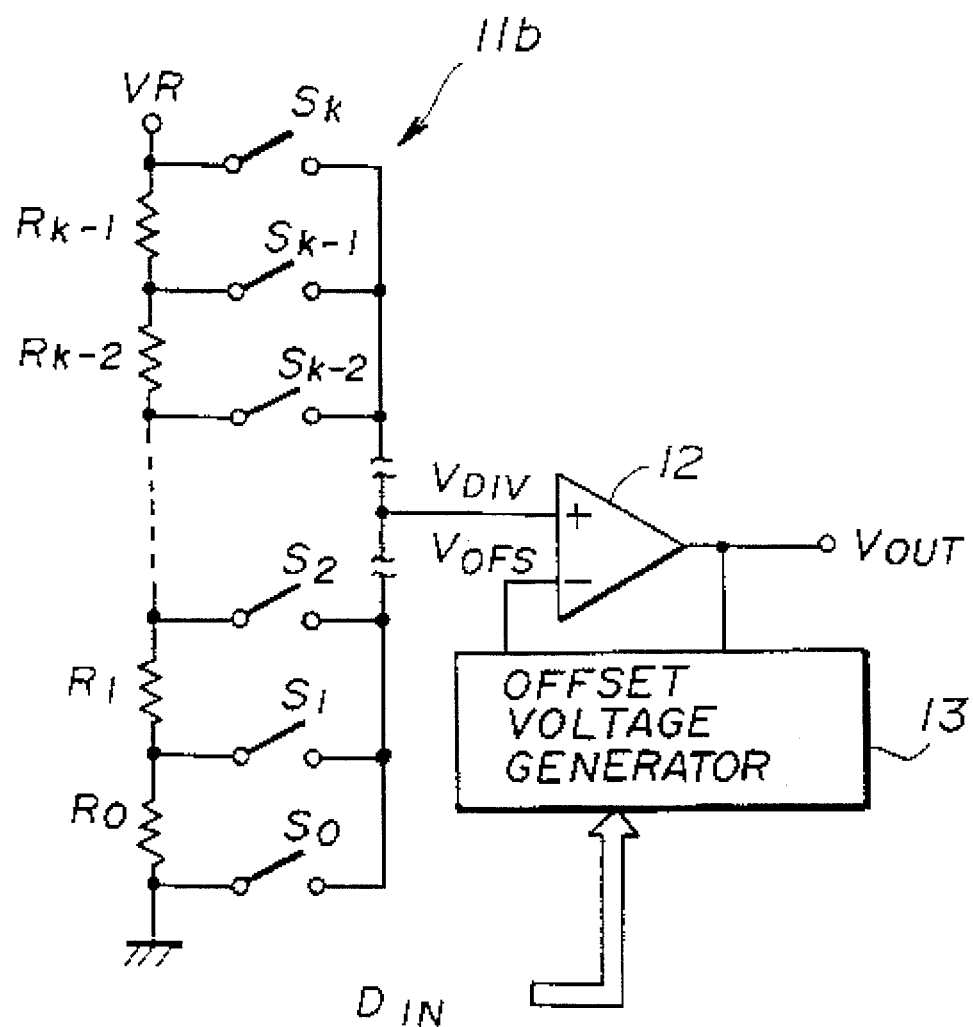
FIG. 3 is a circuit diagram of the D/A converter according to the first embodiment of the present invention in detail.

FIG. 3 is a circuit diagram illustrating the first embodiment of the present invention. The first embodiment of the present invention is made up of an analog voltage generator (also referred to as a resistor network type voltage divider) 11b, an operational amplifier 12, and an offset voltage generator 13, which respectively correspond to the analog voltage generator 100, the offset voltage generator 200 and the output buffer 300 shown in FIG. 2.

Figure 1:
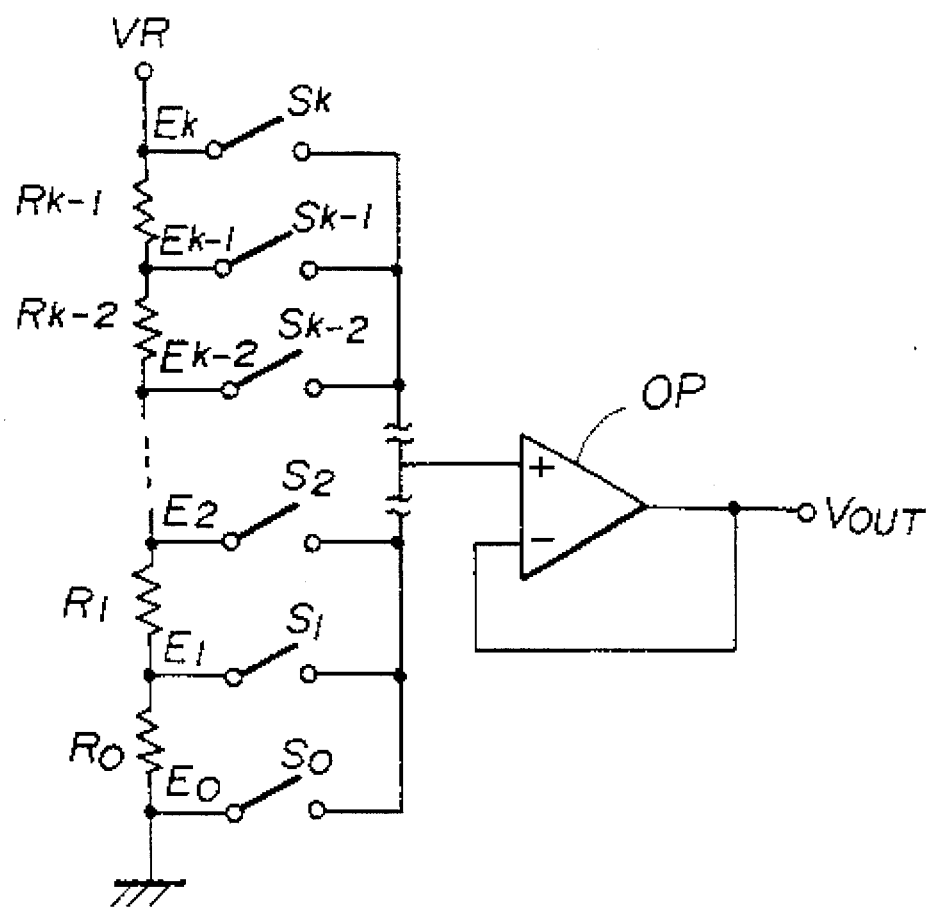
FIG. 1 is a circuit diagram of a conventional D/A converter.

The analog voltage generator 11b comprises the aforementioned resistors $R_0$–$R_{k-1}$, and the switches $S_0$–$S_k$ shown in FIG. 1. The output signal of the analog voltage generator 11b is indicated as $V_{DIV}$, which is applied to the non-inverting input terminal of the operational amplifier 12. The offset voltage generator 13 is connected between the inverting input terminal and the output terminal of the operational amplifier 12. The offset voltage generator 13 generates an offset voltage $V_{OFS}$, which varies on the basis of a digital input signal $D_{IN}$. More particularly, the offset voltage $V_{OFS}$ is stepwise changed over m steps, which number of steps is equal to the number of bits forming the digital input signal $D_{IN}$.

The output voltage $V_{OUT}$ of the operational amplifier 12 is written as follows:

$$V_{OUT} = V_{DIV} + V_{OFS}.$$

where the amplification factor A of the operational amplifier 12 is set equal to 1.

The analog voltage $V_{DIV}$ is equal to one of the (k+1) (=$2^n$) voltages $E_0$–$E_k$. Hence, the D/A converter functions as an (n+p)-bit D/A converter where $2^p$ is equal to m. This means that the resolution in the D/A conversion is increased by m times that of the original D/A converter which does not employ the offset voltage generator 13. It is to be noted that an increase in the number of bits of the digital input signal can be achieved without increasing the number of resistors and switches of the analog voltage generator 100.

The n bits among the (n+p) bits of the digital input signal are used to control the switches $S_0$–$S_k$, and the p bits thereof are used to change the offset voltage $V_{OFS}$. The n bits used may be n high-order bits of the digital input signal, and the p bits used may be the remaining p low-order bits.

Figure 4:
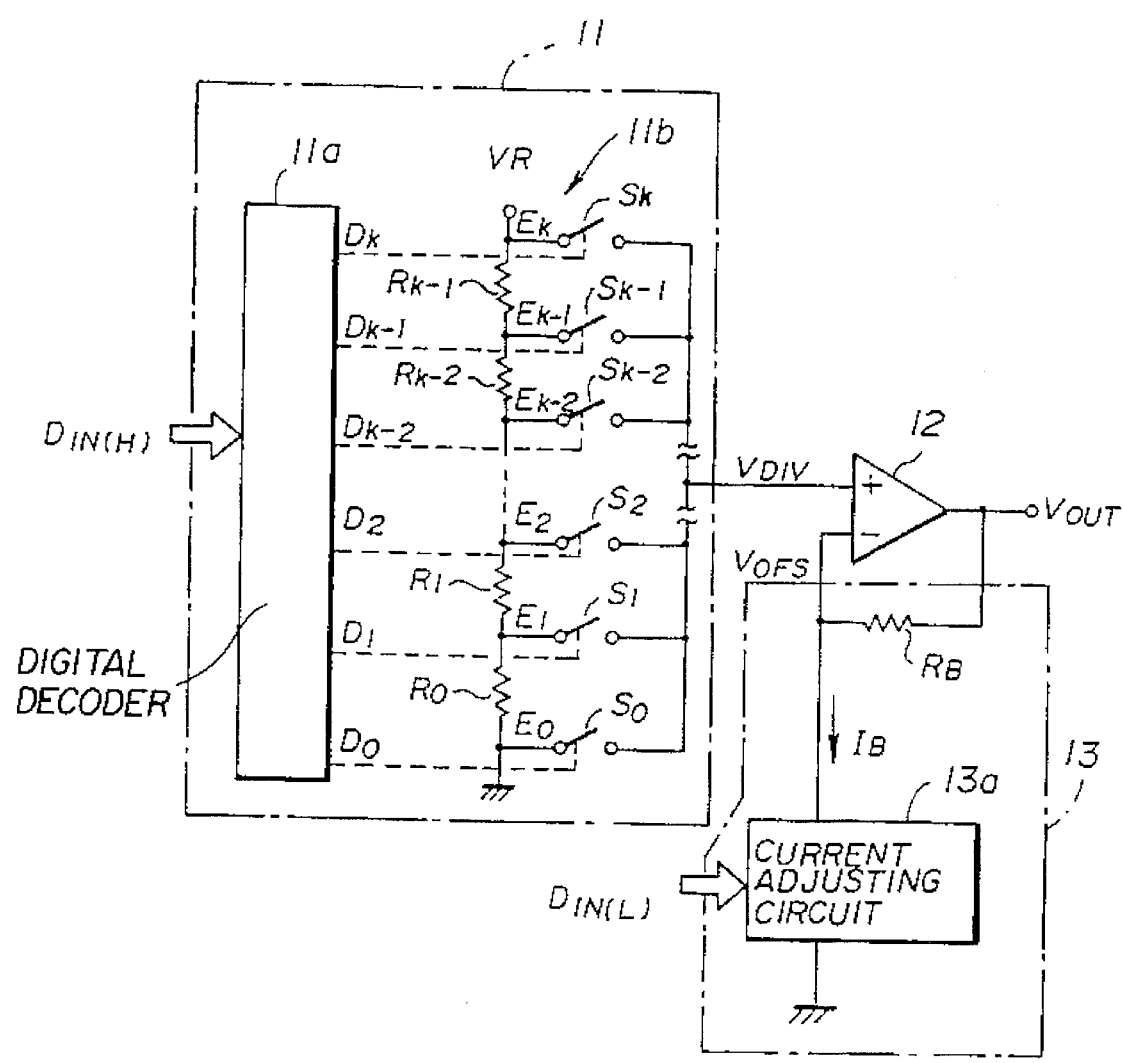
FIG. 4 is a more detailed circuit diagram of the D/A converter according to the first embodiment of the present invention.

FIG. 4 is a circuit diagram of the first embodiment of the present invention in more detail. An analog voltage generator 11, which corresponds to the analog voltage generator 100 shown in FIG. 2, is made up of a digital decoder 11a and the resistor network type voltage divider 11b. The digital decoder 11a decodes an n-bit digital input signal $D_{IN(H)}$, and thereby generates (k+1) (=$2^n$) decoded signals $D_0, D_1, D_2, \ldots, D_k$.

The resistor network type voltage divider 11b includes k resistors $R_0$–$R_{k-1}$ connected in series between ground (the potential $E_0$ thereof is 0 V) and the power supply line set at the voltage $V_R$. The resistors $R_0$–$R_{k-1}$ have the same resistance. The (k+1) switches $S_0$–$S_k$ are provided as shown in FIG. 4 and are controlled by the decoded signals $D_0$–$D_k$. The digital decoder 11a turns ON one of the decoded signals $D_0$–$D_k$ in response to the value indicated by the n-bit digital input signal $D_{IN(H)}$.

The offset voltage generator 13 is made up of a resistor $R_B$ and a current adjusting circuit 13a. The resistor $R_B$ is connected between the inverting input terminal and the output terminal of the operational amplifier 12. The current adjusting circuit 13a adjusts a current $I_B$ flowing in the resistor $R_B$ in accordance with the value indicated by a p-bit digital input signal $D_{IN(L)}$ applied to the current adjusting circuit 13a. For example, the n-bit digital input signal $D_{IN(H)}$ consists of n high-order bits of an (n+p)-bit digital input signal, and the p-bit digital input signal $D_{IN(L)}$ consists of remaining p low-order bits of the (n+p)-bit digital input signal.

Figure 5:
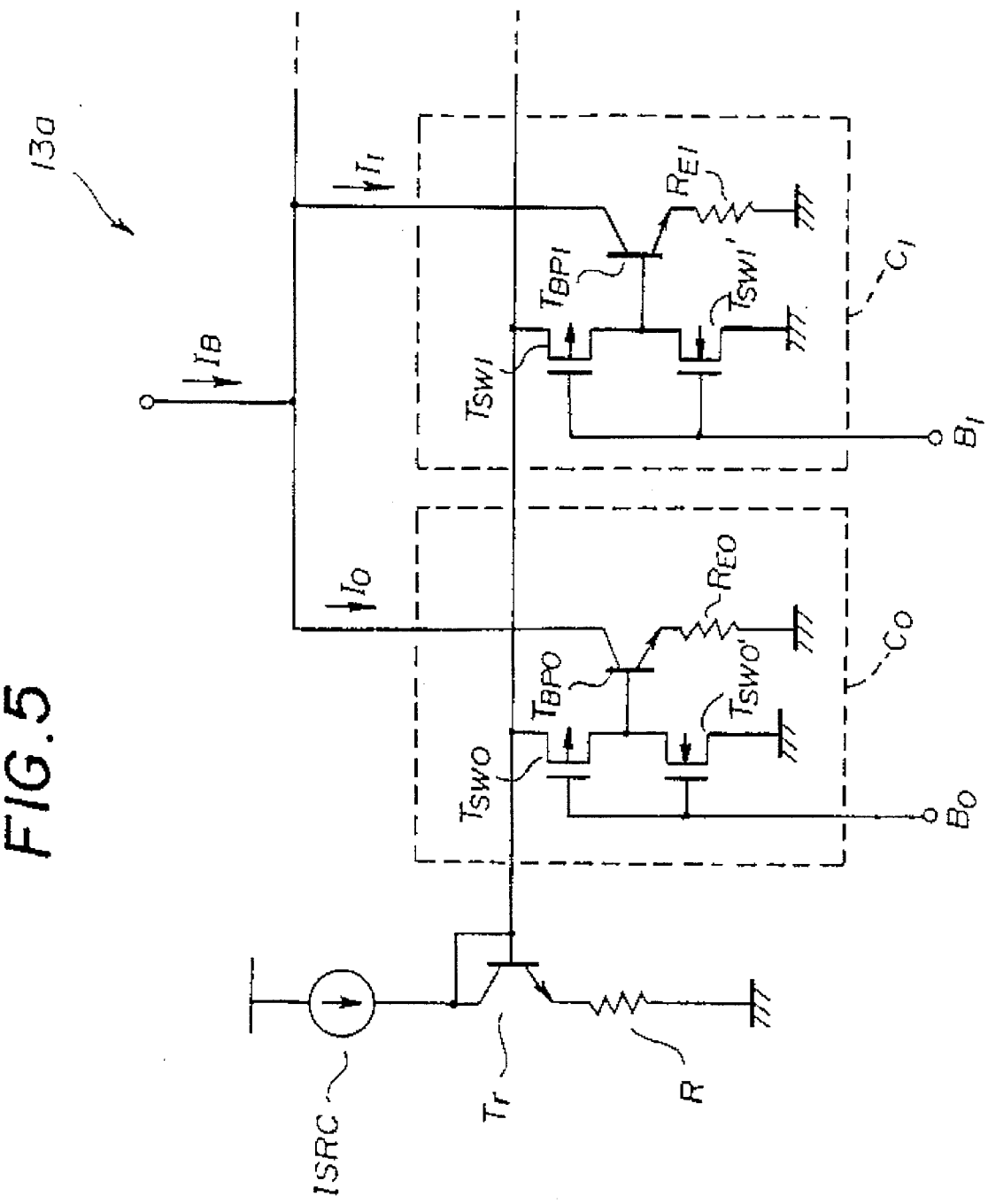
FIG. 5 is a circuit diagram of a current adjusting circuit shown in FIG. 4.

FIG. 5 is a circuit diagram of the current adjusting circuit 13a shown in FIG. 4. The current adjusting circuit 13a includes a plurality of circuits $C_0, C_1, \ldots$. In FIG. 5, two circuits $C_0$ and $C_1$ are illustrated. The number of circuits $C_0, C_1, \ldots$ is equal to the number of bits of the digital input signal $D_{IN(L)}$. In FIG. 5, two bits $B_0$ and $B_1$ of the digital input signal $D_{IN(L)}$ are applied to the circuits $C_0$ and $C_1$, respectively.

Further, the current adjusting circuit 13a comprises a constant-current source ISRC, an npn bipolar transistor Tr and a resistor R. The current source ISRC is connected between the power supply line set at, for example, the aforementioned voltage $V_R$ and the collector of the bipolar transistor Tr. The collector of the bipolar transistor Tr is connected to the base thereof, so that the bipolar transistor Tr functions as a diode. The emitter of the bipolar transistor Tr is grounded via the resistor R.

The transistor Tr and the circuits $C_0, C_1, \ldots$ form a current mirror circuit.

The circuit $C_0$ is made up of an n-channel MOSFET (Metal Oxide Semiconductor Field Effect Transistor) $T_{SW0}$, a p-channel MOSFET $T_{SW0'}$, an npn bipolar transistor $T_{BP0}$, and an emitter resistor $R_{E0}$. Similarly, the circuit $C_1$ is made up of an n-channel MOSFET (Metal Oxide Semiconductor Field Effect Transistor) $T_{SW1}$, a p-channel MOSFET $T_{SW1'}$, an npn bipolar transistor $T_{BP1}$, and an emitter resistor $R_{E1}$.

When the bit $B_0$ of the digital input signal $D_{IN(L)}$ is at a high level, the n-channel MOS transistor $T_{SW0}$ turns ON, and the p-channel MOS transistor $T_{SW0'}$ turns OFF. Hence, the bipolar transistor $T_{BP0}$ turns ON, and a current $I_0$ flows in the bipolar transistor $T_{BP0}$ and the resistor $R_{E0}$. When the bit $B_1$ of the digital input signal $D_{IN(L)}$ is at a high level, the n-channel MOS transistor $T_{SW1}$ turns ON, and the p-channel MOS transistor $T_{SW1'}$ turns OFF. Hence, the bipolar transistor $T_{BP1}$ turns ON, and a current $I_1$ flows in the bipolar transistor $T_{BP1}$ and the resistor $R_{E1}$.

The currents $I_0$ and $I_1$ are designed so that the current $I_1$ is twice the current $I_0$. If the digital input signal consists of p bits, the ratio of the p currents $I_0, I_1, \ldots, I_p$ should be $1:2^1 \ldots :2^p$. The sum of the p currents $I_0, I_1, \ldots, I_p$ is denoted as $I_B$ shown in FIGS. 4 and 5. In order to weight the currents respectively flowing in the circuits $C_0, C_1, \ldots, C_p$, the resistances of the emitter resistors $R_{E0}, R_{E1}, \ldots R_{Ep}$ are weighted so that the ratio of the resistances of the resistors $R_{E0}, R_{E1}, \ldots, R_{Ep}$ should be $1:2^1 \ldots :2^p$. It is also possible to replace the bipolar transistors Tr $T_{PB0}, T_{BP1}, \ldots, T_{BPp}$ by MOSFETs. In this case, the emitter resistors R, $R_{E0}$, $R_{VE1}, \ldots, R_{Ep}$ are not normally used. One method for weighting the currents $I_0, I_1, \ldots, I_p$ is weighting the transistor sizes of the MOSFETs. The ratio of the sizes of the MOSFETs should be $1:2^1 \ldots :2^p$. Another method to weight the currents $I_0, I_1, \ldots, I_p$ is to place weighted numbers of MOSFETs of the same size. The numbers of MOSFETs provided in the circuits $C_0, C_1, \ldots, C_p$ should be $1:2^1 \ldots :2^p$, respectively. The plural MOSFETs in the same circuits are connected in parallel.

The voltage $V_B$ developed across the resistor $R_B$ can be written as follows:

$$V_B = I_B \cdot R_B.$$

As has been described previously, the output voltage $V_{OUT}$ of the operational amplifier 12 (that is, the analog output signal of the D/A converter) can be described as follows:

$$V_{OUT} = V_{DIV} + V_{OFS}$$

where the amplification factor A of the operational amplifier 12 is equal to 1. The voltage $V_B$ is proportional to the current $I_B$, and the current $I_B$ varies on the basis of the combinations of the bits $B_0$ and $B_1$. Hence, the analog voltage $V_{DIV}$ can be stepwise changed over m (=$2^p$) steps on the basis of the number m of combinations of the bits of the digital input signal $D_{IN(L)}$. Hence, the number (k+1) (=$2^n$) of steps of the analog voltage $V_{DIV}$ between $E_0$ and $E_k$ can be substantially increased by m times the $2^n$, and the resolution of the D/A conversion can be increased by m times that of the $2^n$-bit D/A conversion.

According to the present invention, if the number of bits of the digital input signal is increased by p, p circuits in the current adjusting circuit 13a are newly provided. Further, it is not necessary to modify the structure of the analog voltage generator 11. Hence, it is easy to provide the (n+p)-bit D/A converter from the n-bit D/A converter. On the other hand, according to the prior art, $2^p$ times resistors and switches must be newly provided. That is, in prior art, as the number of bits of the digital input signal to be added increases, the number of parts exponentially increases.

Figure 6:
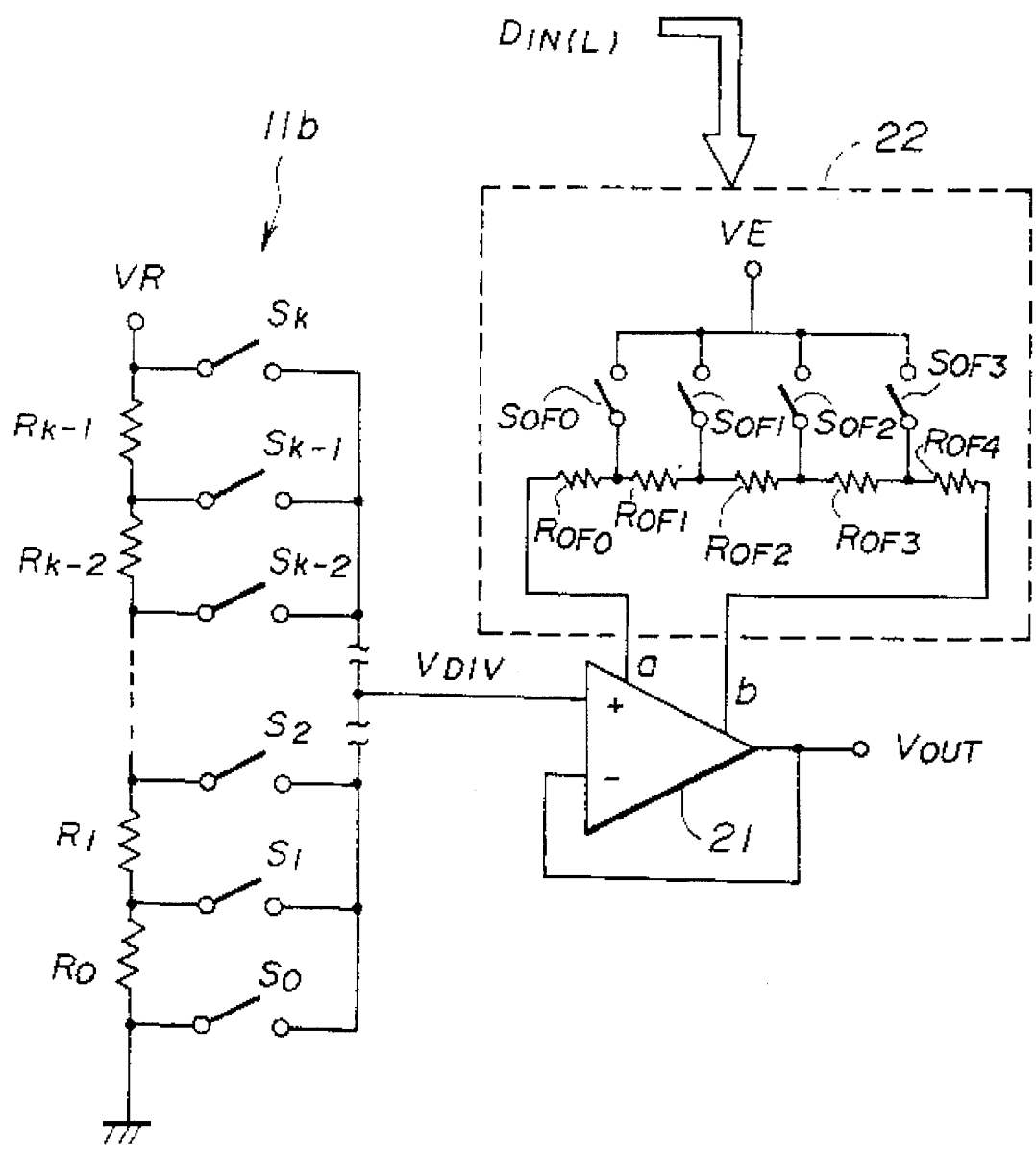
FIG. 6 is a circuit diagram of a D/A converter according to a second embodiment of the present invention.

FIG. 6 is a circuit diagram of a D/A converter according to a second embodiment of the present invention. The second embodiment employs an operational amplifier 21 with offset adjustment terminals a and b. Such an operational amplifier is, for example, an LF357 manufactured by National Semiconductor of U.S. A.

The inverting input terminal and the output terminal of the operational amplifier 21 are directly connected to each other. An offset voltage generator 22 is connected between the offset adjustment terminals a and b of the operational amplifier 21. A series circuit made up of resistors $R_{OF0}$, $R_{OF1}, R_{OF2}, R_{OF3}$ and $R_{OF4}$ connected in series is connected between the offset adjustment terminals a and b. Switches $S_{OF0}, S_{OF1}, S_{OF2}$ and $S_{OF3}$ are connected to respective nodes of the series circuit of the resistors $R_{OF0}$–$R_{OF4}$. A constant voltage VE is applied in common to the switches $S_{OF0}, S_{OF1}, S_{OF2}$ and $S_{OF3}$. The switches $S_{OF0}, S_{OF1}, S_{OF2}$ and $S_{OF3}$ are respectively turned ON and OFF in response to the digital input signal $D_{IN}(L)$. More particularly, only one of the switches $S_{OF0}, S_{OF1}, S_{OF2}$ and $S_{OF3}$ is turned ON on the basis of the value indicated by the digital input signal $D_{IN(L)}$.

The second embodiment of the present invention has the same advantages as the first embodiment thereof. It will be noted that only the resistor network type voltage divider 11b is illustrated for the sake of simplicity. For example, the analog voltage generator used in the second embodiment of the present invention is the same as that shown in FIG. 4.

Figure 7:
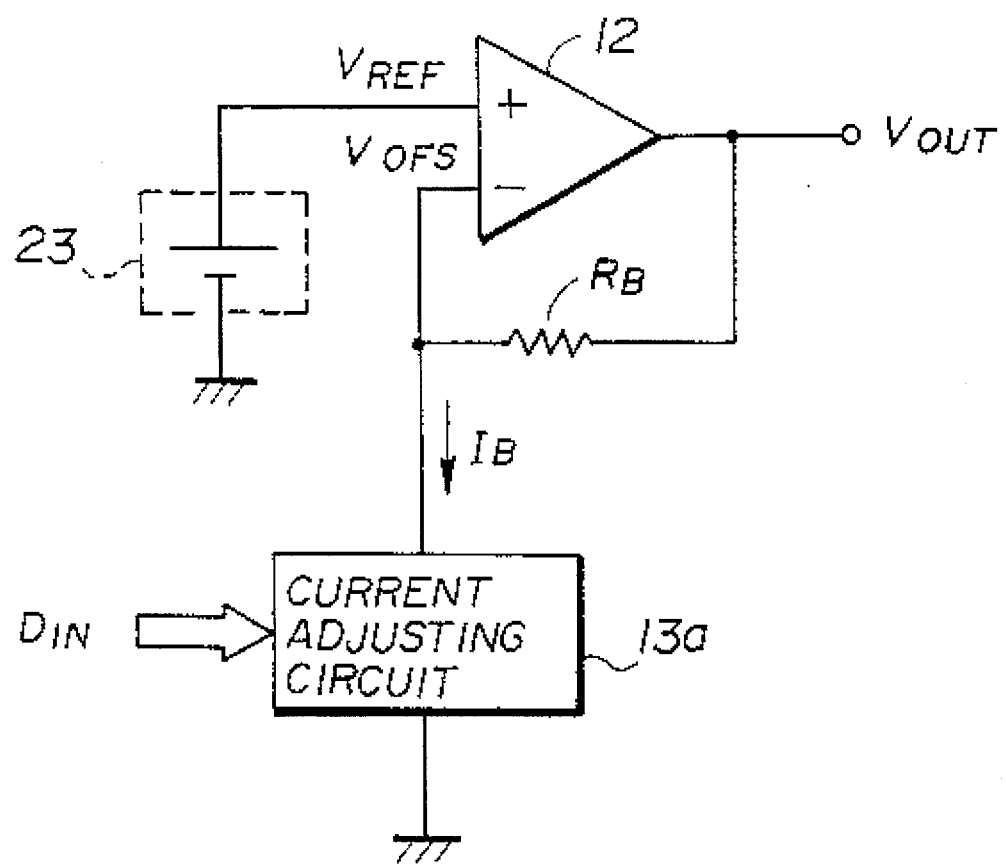
FIG. 7 is a circuit diagram of a D/A converter according to a third embodiment of the present invention.

FIG. 7 is a circuit diagram of a D/A converter according to a third embodiment of the present invention. A constant voltage $V_{REF}$ generated by a constant-voltage source 23 is applied to the non-inverting input terminal of the operational amplifier 12. The constant-voltage source 23 functions as the analog voltage generator 100 shown in FIG. 2. The offset voltage $V_{OFS}$ having the magnitude based on the digital input signal $D_{IN(L)}$ is connected between the inverting input terminal and the output terminal of the operational amplifier 12. The sum of the constant voltage $V_{REF}$ and the offset voltage $V_{OFS}$ is amplified by the operational amplifier 12. When the digital input signal $V_{OFS}$ consists of p bits, the analog output voltage $V_{OUT}$ changes stepwise over $2^p$ levels. According to the third embodiment of the present invention, a less-expensive D/A converter having a small resolution of the D/A conversion can be provided.

It will be noted that the analog voltage generator 100 is not limited to resistor network type voltage dividers, and arbitrary types of analog voltage generators can be used. For example, a weighted resistor type analog voltage generator can be used which is comprised of resistors weighted based on the digits of the input digital signal, and switches. A weighted current type analog voltage generator can also be used which is comprised of constant-current sources weighted based on the digitals of the input digital signal, and switches. A ladder resistor type analog voltage generator can also be used which resistors are connected so that a "ladder" is formed. The offset voltage generator 200 is not limited to the specifically disclosed configurations. It is important to add the offset voltage $V_{OFS}$ to the analog voltage obtained by D/A conversion or generated by the constant voltage source and to vary the offset voltage $V_{OFS}$ on the basis of the digital input signal.

The D/A converters according to the present invention can easily be designed, particularly using a primitive simulation process, which is one of the processes for simulating circuits using a computer (see Japanese Laid-Open Patent Publication No. 2-1046). In the primitive process, a mathematical expression model is defined for each function block rather than element parts, such as transistors, resistors and capacitors. For example, if a mathematical expression model is defined for an operational amplifier, the operational amplifier can be described by a minimum mathematical expression model expressing the relationship among the inverting input terminal, the non-inverting input terminal and the output terminal. It is also possible to describe the analog voltage generator 100 by a minimum mathematical expression model between the input and output terminals thereof. The design of D/A converters according to the present invention can be facilitated, particularly using the primitive simulation process.

The present invention is not limited to the specifically disclosed embodiments, and variations and modifications may be made without departing from the scope of the present invention.

What is claimed is:

1. An apparatus supplied with a digital input signal, and reference and ground voltages, comprising:

an operational amplifier having first and second input terminals, and an output terminal;

a plurality of switches having respective input terminals and respective output terminals coupled to the first input terminal of the operational amplifier, each of the plurality of switches having an open or closed state based on a respective bit included in a first part of the digital input signal;

a plurality of resistors coupled in series between the reference and ground voltages, and having connection points between adjacent resistors, the connection points being coupled to respective switches; and an offset voltage generator coupled between the second input terminal and the output terminal, to generate an offset voltage based on a second part of the digital input signal.

2. An apparatus as claimed in claim 1, wherein the offset voltage generator includes a first resistor having a first end coupled to the output terminal of the operational amplifier, and a second end coupled to the second input terminal of the operational amplifier, and a current adjusting circuit to adjust current flowing through the first resistor, based on the second part of the digital input signal.

3. An apparatus as claimed in claim 2, wherein the current adjusting circuit includes a constant current source, a first bipolar transistor having a base and a collector coupled to the constant current source, and an emitter, a second resistor coupled to the emitter, a plurality of circuit units coupled in parallel, each circuit unit including a p-channel metal oxide semiconductor field effect transistor (MOSFET) having a first channel terminal coupled to the base of the first bipolar transistor, a gate terminal and a second channel terminal, an n-channel MOSFET having a gate terminal, a first channel terminal coupled to the second channel terminal of the p-channel MOSFET, and a second channel terminal coupled to the ground voltage, and a second bipolar transistor having a base coupled to the second channel terminal of the p-channel MOSFET and the first channel terminal of the n-channel MOSFET, a collector coupled to the second end of the first resistor, and an emitter, a resistor coupled to the emitter of the second bipolar transistor, the gate terminal of the n-channel MOSFET and the gate terminal of the p-channel MOSFET receiving a respective bit of the second part of the digital input signal.

4. An apparatus as claimed in claim 2, wherein the current adjusting circuit includes a plurality of MOSFETs coupled in parallel between the second end of the first resistor and the ground voltage, and receiving respective bits of the digital input signal at respective gate terminals of the MOSFETs.

5. An apparatus supplied with a digital input signal, first reference, second reference and ground voltages, comprising:

an operational amplifier having first and second input terminals, first and second offset terminals, and an output terminal, the output terminal of the operational amplifier being coupled to the second input terminal of the operational amplifier;

a first plurality of switches having respective input terminals and respective output terminals coupled to the first input terminal of the operational amplifier, respective ones of the first plurality of switches having an open or closed state based on a first part of the digital input signal;

a first plurality of resistors coupled in series between the first reference and ground voltages, and having connection points between adjacent ones of the first plurality of resistors, the connection points being coupled to respective switches;

a second plurality of resistors coupled in series between the first and second offset terminals of the operational amplifier, and having connection points between adjacent ones of the second plurality of resistors; and a second plurality of switches having respective input terminals and respective output terminals coupled receive the second reference voltage, the respective output terminals of the second plurality of switches being coupled to the connection points between the second plurality of resistors, and the second plurality of switches receiving respective bits of a second part of the digital input signal.

6. A digital to analog converter which receives a first digital input signal and a second digital input signal, comprising:

an operational amplifier having first and second input terminals, an output terminal, and first and second offset control terminals;

an analog voltage generator which generates an analog voltage based on the first digital input signal and is coupled to the first input terminal of the operational amplifier to provide the analog voltage to the first input terminal of the operational amplifier; and an offset voltage generator having a first terminal coupled to the first offset control terminal of the operational amplifier, and a second terminal coupled to the second offset control terminal of the operational amplifier, to generate an offset voltage based on the second digital input signal.

7. A digital to analog converter as claimed in claim 6, wherein the offset voltage generator is supplied with a reference voltage and comprises:

first resistor means for generating a variable resistance based on the second digital input signal; and second resistor means for generating a variable resistance based on the second digital input signal, the first resistor means and the second resistor means being coupled in series between the first and second offset control terminals of the operational amplifier, a connection point existing between the first resistor means and the second resistor means with the reference voltage being connected to the connection point.

8. A digital-to-analog converter as claimed in claim 6, wherein the offset voltage generator is supplied with a reference voltage and comprises:

a plurality of resistors coupled in series between the first and second offset control terminals of the operational amplifier, and having respective connection points between adjacent series coupled resistors; and a plurality of switches respectively corresponding to the connection points of the plurality of resistors, each switch having an input terminal and an output terminal, the input terminal of each switch connected to the reference voltage and the output terminal of each switch connected to the respectively corresponding connection point of the plurality of resistors, each switch having an open and close state which is controlled by a respective bit of the second digital input signal.

9. A digital-to-analog converter which receives a digital input signal, comprising:

an operational amplifier having first and a second input terminals and an output terminal;

an analog voltage generator which generates an analog voltage and is coupled to the first input terminal of the operational amplifier to provide the analog voltage to the first input terminal of the operational amplifier; and an offset voltage generator which is coupled between the second input terminal and the output terminal of the operational amplifier and generates an offset voltage based on the digital input signal, wherein the offset voltage generator comprises
a first resistor having a first end coupled to the output terminal of the operational amplifier, and a second end coupled to the second input terminal of the operational amplifier, and
a current adjusting circuit to adjust current flowing through the first resistor, based on the digital input signal.

10. A digital-to-analog converter as claimed in claim 9, wherein the digital input signal comprises p bits where p is an integer, a current flows through the first resistor of the offset voltage generator, and the current adjusting circuit comprises:

p transistor circuits coupled in common to the first resistor of the offset voltage generator with p predetermined currents respectively corresponding to, and flowing through, the p transistor circuits, the amount of the respective p predetermined currents flowing through the p transistor circuits being based on the values of the p bits of the digital input signal, and the sum of the p predetermined currents corresponds to the current flowing through the first resistor.

11. A digital-to-analog converter as claimed in claim 10, wherein the p predetermined currents have respectively weighted magnitudes based on the bits of the digital input signal.

12. A digital-to-analog converter as claimed in claim 11, wherein the current adjusting circuit further comprises:

a current source;

a current adjusting circuit transistor having first, second and third terminals, the first and second terminals being coupled to the current source;

a current adjusting circuit resistor coupled to the third terminal of the current adjusting circuit transistor;

wherein the p transistor circuits are coupled in parallel, each transistor circuit comprising:
a first transistor having first, second and third terminals;
a first resistor coupled to the third terminal of the first transistor of the respective transistor circuit;
a second transistor having first, second and third terminals, the second terminal coupled to the first terminal of the current adjusting circuit transistor, and a third terminal coupled to the first terminal of the first transistor of the respective transistor circuit;
a third transistor having first, second and third terminals, the second terminal coupled to the first terminal of the first transistor of the respective transistor circuit; and
the first terminal of the second transistor of the respective transistor circuit and the first terminal of the third transistor of the respective transistor circuit each receiving the same, respective bit of the digital input signal.

13. A digital-to-analog converter as claimed in claim 12, wherein the resistances of the first resistors of the respective transistor circuits are weighted, based on the bits of the digital input signal.

14. A digital-to-analog converter as claimed in claim 12, wherein:

the current adjusting circuit resistor and the respective first resistors of the respective transistor circuits each have resistance of approximately zero; and the respective first transistors of the respective transistor circuits are bipolar transistors with emitter areas which are weighted based on the bits of the digital input signal.

15. A digital-to-analog converter as claimed in claim 12, wherein:

the current adjusting circuit resistor and the respective first resistors of the respective transistor circuits each have resistance of approximately zero; and the respective first transistors of the respective transistor circuits are field effect transistors with channel areas which are weighted based on the bits of the digital input signal.

16. A digital-to-analog converter as claimed in claim 12, wherein:

the current adjusting circuit resistor and the respective first resistors of the respective transistor circuits each have approximately zero resistance; and the respective first transistors of the respective transistor circuits are arranged in parallel to correspond to the p bits of the digital input signal.

17. An digital-to-analog converter which receives a first digital input signal and a second digital input signal, comprising:

an operational amplifier having first and second input terminals and an output terminal;

an analog voltage generator which generates an analog voltage based on the first digital input signal and is coupled to the first input terminal of the operational amplifier to provide the analog voltage to the first input terminal of the operational amplifier; and an offset voltage generator which is coupled between the second input terminal and the output terminal of the operational amplifier and generates an offset voltage based on the second digital input signal, wherein the first digital input signal and the second digital input signal form a single digital input signal with the first digital input signal corresponding to high order bits of the single digital input signal and the second digital input signal corresponding to low order bits of the single digital input signal.

18. An digital-to-analog converter which receives a first digital input signal and a second digital input signal, comprising:

an operational amplifier having first and second input terminals and an output terminal;

an analog voltage generator which generates an analog voltage based on the first digital input signal and is coupled to the first input terminal of the operational amplifier to provide the analog voltage to the first input terminal of the operational amplifier; and an offset voltage generator which is coupled between the second input terminal and the output terminal of the operational amplifier and generates an offset voltage based on the second digital input signal, wherein the analog voltage generator comprises means for changing the analog voltage in steps based on the first digital input signal, and the analog voltage generator is supplied with a first reference voltage, the analog voltage generator further comprising a first resistor means for generating a variable resistance based on the first digital input signal, and a second resistor means for generating a variable resistance based on the first digital input signal, the first resistor means and the second resistor means being coupled in series to the first reference voltage with a connection point between the first resistor means and the second resistor means, the connection point being coupled to the first input terminal of the operational amplifier.

19. An digital-to-analog converter which receives a first digital input signal and a second digital input signal, comprising:

an operational amplifier having first and second input terminals and an output terminal;

an analog voltage generator which generates an analog voltage based on the first digital input signal and is coupled to the first input terminal of the operational amplifier to provide the analog voltage to the first input terminal of the operational amplifier; and an offset voltage generator which is coupled between the second input terminal and the output terminal of the operational amplifier and generates an offset voltage based on the second digital input signal, wherein the analog voltage generator comprises means for changing the analog voltage in steps based on the first digital input signal, and the analog voltage generator is supplied with a first reference voltage, the analog voltage generator further comprising a plurality of resistors coupled in series to the first reference voltage and having a respective connection point between adjacent series coupled resistors, and a plurality of switches, each switch having an input terminal and an output terminal, the input terminal connected to a respective connection point and the output terminal connected to the first input terminal of the operational amplifier, each switch having an open and close state which is controlled by a respective bit of the first digital input signal.

* * * * *

UNITED STATES PATENT AND TRADEMARK OFFICE
CERTIFICATE OF CORRECTION

PATENT NO. : 5,585,795
DATED : December 17, 1996
INVENTOR(S) : Yuasa et al.

Page 1 of 2

It is certified that error appears in the above-indentified patent and that said Letters Patent is hereby corrected as shown below:

<u>Title Page</u>, after "[22] Filed: ...", insert the following new lines: --Foreign Application Priority Data
April 6, 1992 [JP] Japan 4-083776--

<u>Column 1</u>, line 32, after "the", delete paragraph indentation.

<u>Column 2</u>, line 23, after "four", insert --times--.

<u>Column 3</u>, line 40, delete "needs", and substitute --only requires the addition of--; delete "$2^P$";
line 41, delete "additionals of" and substitute --p parts over--;
line 49, delete "offset voltage generator" and substitute --output buffer--;
line 50, delete "output buffer" and substitute --offset voltage generator--.

<u>Column 4</u>, line 48, "$C_1$..." should be --$C_1$....--;
line 65, delete "an n-channel" and substitute --a p-channel--;
line 67, delete "a p-channel" and substitute --an n-channel--.

<u>Column 5</u>, line 2, "an n-channel" should be --a p-channel--;
line 3, "a p-channel" should be --an n-channel--;
line 6, "high" should be --low--; and "n-channel" should be --p-channel--;

UNITED STATES PATENT AND TRADEMARK OFFICE
CERTIFICATE OF CORRECTION

PATENT NO. : 5,585,795
DATED : Yuasa et al.
INVENTOR(S) : December 17, 1996

It is certified that error appears in the above-indentified patent and that said Letters Patent is hereby corrected as shown below:

line 7, "p-channel" should be --n-channel--;
line 10, "high" should be --low--;
line 11, "n-channel" should be --p-channel-- and "p-channel" should be --n-channel--;
line 23, "1:2'" should be --1:$2^{-P}$-- and ":$2^{P}$" should be --:$2^{-1}$--.

Column 6, line 54, "200" should be --300--.

Column 8, line 42, "digital to analog" should be --digital-to-analog--;
line 59, "digital to analog" should be --digital-to-analog--;

Column 10, line 54, "An" should be --A--.

Column 11, line 7, "An" should be --A--.

Column 12, line 3, "An" should be --A--.

Signed and Sealed this

Eighth Day of July, 1997

Attest:

Attesting Officer

BRUCE LEHMAN

Commissioner of Patents and Trademarks